(12) United States Patent
Ransquin et al.

(10) Patent No.: US 8,383,928 B2
(45) Date of Patent: Feb. 26, 2013

(54) CONCENTRATION SOLAR BATTERY PROTECTED AGAINST HEATING

(75) Inventors: Johan Ransquin, Antibes (FR); Laurent D'Abrigeon, Theoule (FR)

(73) Assignee: Thales, Neuilly sur Seine (FR)

( * ) Notice: Subject to any disclaimer, the term of this patent is extended or adjusted under 35 U.S.C. 154(b) by 2334 days.

(21) Appl. No.: 10/510,183

(22) PCT Filed: Apr. 1, 2003

(86) PCT No.: PCT/FR03/01002
§ 371 (c)(1),
(2), (4) Date: Sep. 30, 2004

(87) PCT Pub. No.: WO03/085745
PCT Pub. Date: Oct. 16, 2003

(65) Prior Publication Data
US 2005/0166952 A1    Aug. 4, 2005

(30) Foreign Application Priority Data
Apr. 11, 2002 (FR) ..................... 02 04528

(51) Int. Cl.
*H01L 31/052* (2006.01)
*H01L 31/0232* (2006.01)
*H01L 31/042* (2006.01)

(52) U.S. Cl. ............ 136/246; 136/259; 136/247
(58) Field of Classification Search ............. 136/246, 136/259, 247
See application file for complete search history.

(56) References Cited

U.S. PATENT DOCUMENTS

| | | | | | |
|---|---|---|---|---|---|
| 3,839,108 | A | * | 10/1974 | Leinkram | 216/48 |
| 4,021,267 | A | * | 5/1977 | Dettling | 136/246 |
| 4,188,238 | A | * | 2/1980 | Boling | 136/247 |
| 4,200,472 | A | * | 4/1980 | Chappell et al. | 136/246 |
| 4,278,829 | A | | 7/1981 | Powell | |
| 5,611,870 | A | * | 3/1997 | Horne et al. | 136/253 |
| 5,658,448 | A | | 8/1997 | Lasich | |
| 5,932,029 | A | * | 8/1999 | Stone et al. | 136/253 |
| 6,399,874 | B1 | * | 6/2002 | Olah | 136/259 |

(Continued)

FOREIGN PATENT DOCUMENTS

DE    31 09 284 A    9/1982
DE    31 30 226 A    2/1983

(Continued)

OTHER PUBLICATIONS

Osborn et al. "Spectral selectivity applied to hybrid concentration systems", Solar Energy Materials, vol. 14, no. 3-5, Nov. 1985, p. 301-325.*

(Continued)

*Primary Examiner* — Golam Mowla
(74) *Attorney, Agent, or Firm* — Sughrue Mion, PLLC

(57) ABSTRACT

The invention concerns concentration solar batteries which are protected against heating caused by the fraction of solar radiation which does not enable excitation of the photovoltaic cells (101) constituting said generator. It consists in covering the concentrator (106) which reflects the solar flux (107) towards the photovoltaic cells (101) with a filter (206) which enables the useless part of the radiation to be eliminated. It consists in using for that purpose either an absorbent material or an oblique or Fresnel stepped arrangement of the outer surface (107) of said transparent layer enabling said useless part to be reflected outside the photovoltaic cells (101).

7 Claims, 2 Drawing Sheets

U.S. PATENT DOCUMENTS

2001/0007261 A1* 7/2001 Kleinwachter ............... 136/246
2008/0186587 A1* 8/2008 Matsushita ................... 359/630

FOREIGN PATENT DOCUMENTS

| EP | 0 019 016 A | 11/1980 |
|---|---|---|
| JP | 60 148174 A | 12/1985 |
| JP | 62 101085 A | 10/1987 |

OTHER PUBLICATIONS

Cassarly, Handbook of Optics, The McGraw-Hill companies, copyright 2001, p. 2.10.*

* cited by examiner

CONCENTRATION SOLAR BATTERY PROTECTED AGAINST HEATING

The present invention relates to photovoltaic generators that concentrate incident light and are protected against the effects of additional heating caused by this concentration. It applies more specifically to photovoltaic generators used in artificial satellites and energized by sunlight.

Using a photovoltaic generator of the kind shown partially in outline from one end in FIG. 1 to supply artificial satellites with electrical energy is known in the art.

The generator comprises a set of photovoltaic cells 101 covered by a transparent plate 102. The transparent plate protects the surface of the cells and filters received direct solar radiation 103 so as to allow only wanted radiation 104 to reach the cells and to reflect unwanted (for example infrared and ultraviolet) radiation 105, as the cells are unable to absorb this radiation to produce electricity. In practice this separation is imperfect and reflection is not total. A portion of the radiation 105 therefore penetrates the layer 102, where most of it is absorbed, a small portion reaching the cell, where it is also absorbed, but without producing electricity.

This partial absorption, as much by the layer 102 as by the cell 101, causes additional heating of the assembly, over and above that resulting from the normal operation of the cell (Joule effect, various losses). This unwanted heating leads to an increase in the operating temperature of the cell and therefore to a reduction of the photovoltaic efficiency, because the performance of a cell is degraded as the temperature rises.

Photovoltaic cells are costly and delicate and assembling them into panels necessitates a structure whose weight is not negligible. Furthermore, the effect of direct cell irradiation fails to achieve saturation in terms of photovoltaic conversion.

Concentrating the sunlight onto the surface of the solar cells covering it to increase the electrical power supplied by a panel of given dimensions is therefore known in the art. To this end a simple solution is generally used that consists in surrounding the panel, or more locally the cells, with inclined plane reflectors like the reflector 106. For simplicity, the figure shows only one of these reflectors, but it is standard practice to use several of them, at least two situated on either side of the panel, or more locally between the rows of cells on the panel.

The solar flux 107 impinging on the concentrator is reflected toward the surface of the layer 102 in the form of a reflected flux 108. As in the case of the direct flux 103, the wanted portion of the reflected radiation penetrates into the layer 102 in the form of a flux 109 to excite the cell 101. The other portion is reflected in the form of a flux 110. The effects of the flux coming from the concentrator are the same as those of the direct flux and therefore lead to additional heating of the solar panel, in direct proportion to the concentration obtained.

This additional heating leads to a reduction in photovoltaic conversion efficiency, because the performance of solar cells is degraded if their operating temperature rises. This phenomenon therefore counteracts to some extent the benefit of using a concentrator.

Furthermore, the concentrators 106 consist of simple, generally metallic, reflective surfaces, in order to be as light as possible. These surfaces absorb virtually none of the incident flux 107 and reflect all of it in the form of the reflected flux 108.

This being so, the operating temperature of the concentrators 106 is a cold temperature.

The concentrators therefore become large cold traps for all circulating molecules, and their surface is rapidly polluted, which leads to a significant reduction in their reflective efficiency, and in due course to a considerable reduction in the efficiency of the photovoltaic generator as a whole.

To overcome these drawbacks, the invention proposes a concentrator photovoltaic generator, comprising at least one photovoltaic cell covered by a transparent protection layer and a reflecting concentrator, characterized in that the concentrator is covered by a filter to eliminate in the luminous flux reflected by the concentrator toward the photoelectric cell most of the "unwanted" radiation that is not able to excite the photovoltaic cell.

According to another feature of the invention, the filter is formed of a layer made from materials absorbing the "unwanted" portion of the radiation.

According to another feature of the invention, the layer forming the filter is of constant thickness.

According to another feature of the invention, the filter is formed of a layer whose exterior face is oriented to divert this "unwanted" radiation out of the voltaic cell.

According to another feature of the invention, the transparent layer is of decreasing thickness so that its exterior face is not parallel to the reflecting surface of the concentrator.

According to another feature of the invention, the exterior face of the transparent layer forming the filter is etched to form Fresnel steps.

Other features and advantages of the invention will become clearly apparent in the course of the following description, which is given by way of nonlimiting example and with reference to the appended drawings, in which.

The invention therefore consists in disposing on the concentrator panel 106 a filter that limits the radiation reflected toward the photoelectric cells essentially to the wavelengths that they are able to use. In one variant, the radiation at the wavelengths eliminated in this way is absorbed in the concentrator to heat it to prevent it becoming a cold trap.

Figure 1:
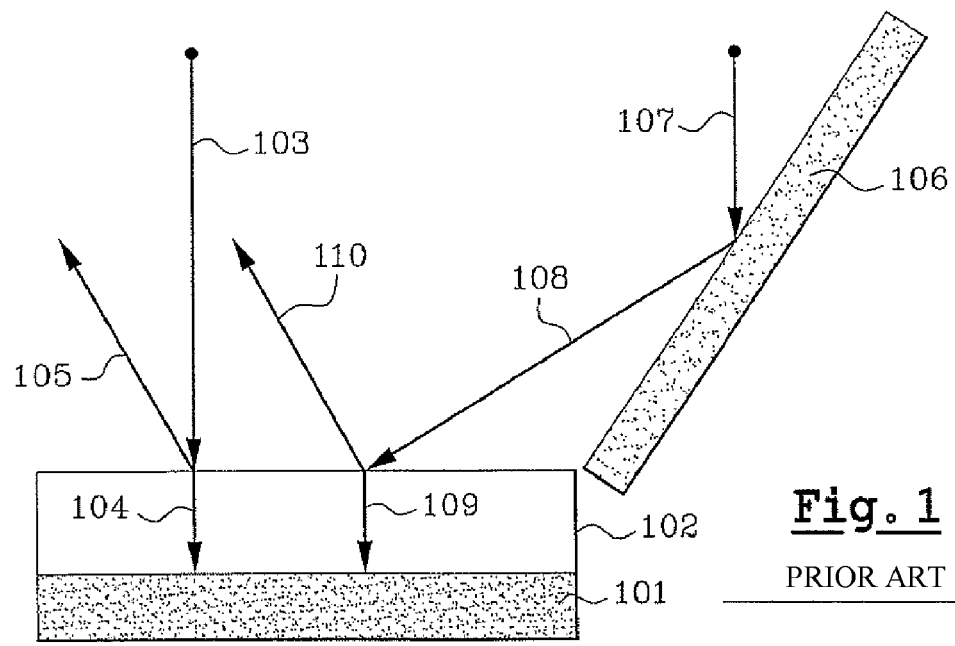
FIG. 1 is an end view of a prior art generator.
Figure 2:
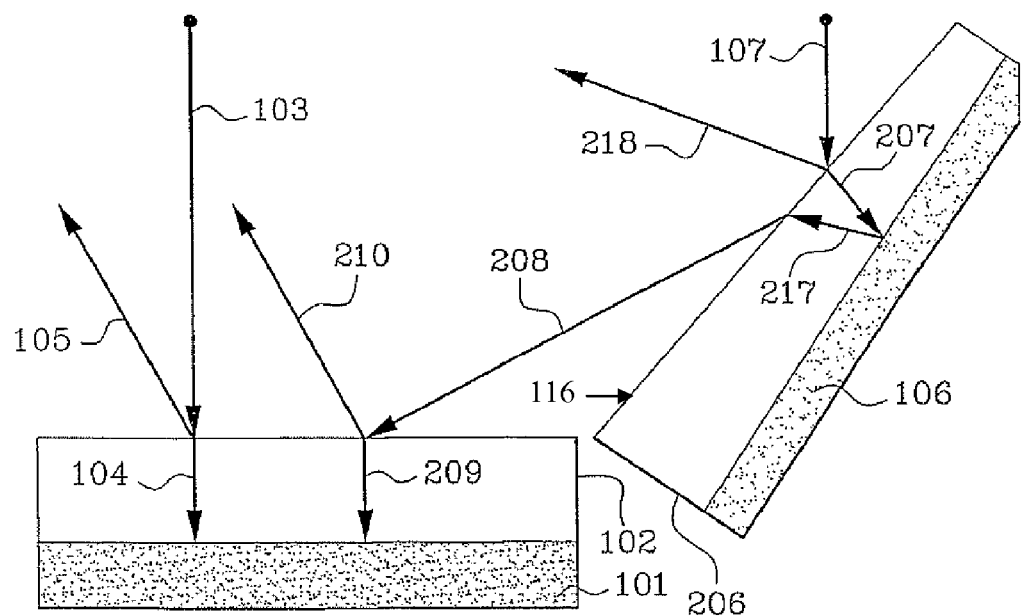
FIG. 2 is a similar view of a first embodiment of a generator according to the invention.

In a first embodiment, shown in FIG. 2, the concentrator 106 is covered with a transparent layer 206 whose exterior face 116 is inclined to the plane of the reflecting face of the concentrator 106 so that the luminous flux 107 is divided into two portions. A first portion 207, corresponding to the wavelengths used for photoelectric conversion, penetrates the filter, is reflected by the concentrator 106 in the form of a flux 217, and then emerges from the inclined face of the filter 206, where it is refracted to form a beam 208 directed toward the upper face of the transparent layer 102 that protects the cells 101.

A second portion 218 of the flux 107, corresponding to the wavelengths that are not able to be used for photoelectric conversion, is subject to total reflection at the upper face of the filter 206 to form a flux 218 that is directed out of the photoelectric device.

The wanted wavelengths of the flux 208 are refracted as flux 209 to excite the cells 101. Given inevitable imperfections and transition effects, the flux 208 nevertheless contains a certain percentage of unwanted wavelengths, a portion of which is reflected in the form of a flux 210 and a residual portion of which contributes to unwanted heating of the cells 101. However, this effect is reduced compared to the absence of any filter.

The necessary inclinations of the concentrator 106 relative to the cells 101 and of the external face 116 of the filter 206 relative to the concentrator are chosen so that there is total reflection of the unwanted wavelengths at the inclined face 116 (remember that refraction on passing from one medium to another, and thus total reflection where applicable, depends on the wavelength of the light rays, which enables this separation), and so that the combination of reflection at the concentrator 106 and refraction on passing through the face 116 directs the wanted wavelengths toward the external surface of the transparent layer 102.

In the example shown in this figure, the filter 206 takes the form of a relatively thick plate whose thickness reduces from one end to the other of the surface of the concentrator 106 to obtain the required inclination. This causes a relatively large increase in the weight of the assembly, which is not necessarily desirable.

In a variant, the filter 206 is formed of a refractive transparent layer whose average thickness is substantially constant and as small as possible. To obtain the desired effect in this case, the exterior face 116 of this layer is machined to form Fresnel steps, to obtain the required effect locally whilst limiting the overall thickness of the filter.

Figure 3:
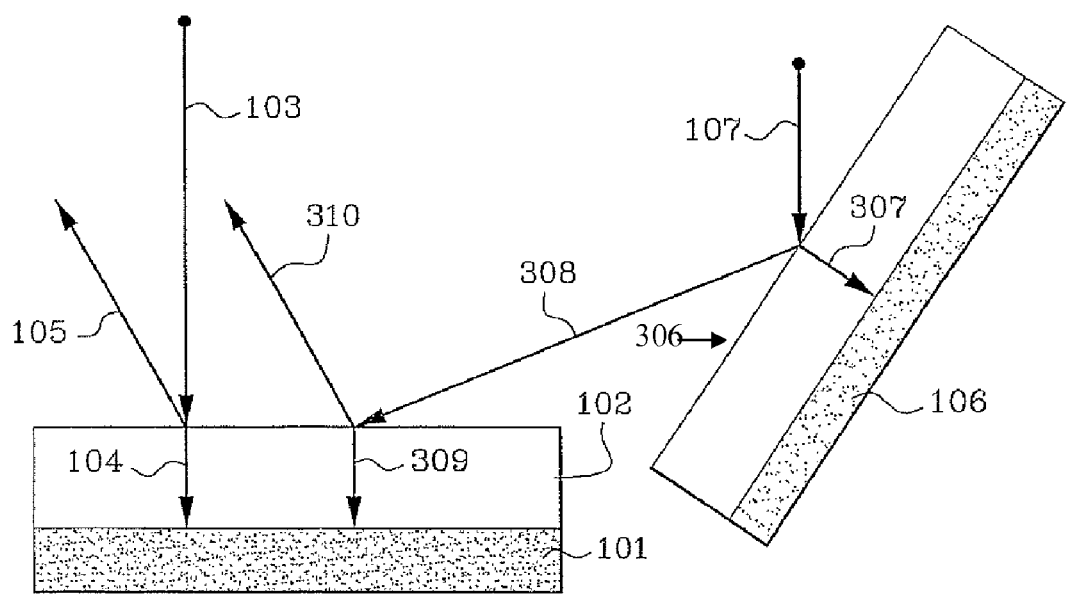
FIG. 3 is a similar view of a second embodiment of a generator according to the invention.

In a second embodiment, shown in FIG. 3, a filter 306 is placed on the reflecting surface of the concentrator 106 and takes the form of a plane plate of uniform thickness. This plate is made from a material that absorbs "unwanted" components of the incident solar flux 107 but is transparent to "wanted" components of the same flux (those enabling photoelectric conversion to be obtained in the cells 101).

A solid absorbent material may be used for this purpose, as is known in the art, and/or a combination of thin reflecting layers with different indices, as is also known in the art.

In the embodiment shown, the angles and the refractive index of the material constituting the layer 306 are chosen so that the path 307 of the solar flux in the layer 306 is of the same length in both directions, reflection at the concentrator 106 occurring in a direction normal to the surface thereof. This is merely one particular example and these paths could be different, as in FIG. 2.

On leaving the filter 306, the solar flux 308 is therefore for the most part freed of "unwanted" components and travels along a path 309 caused by refraction until it impinges on the exterior surface of the transparent layer 102 to excite the cells 101.

As in the first embodiment, a portion of this "unwanted" flux is reflected at the surface of the transparent layer 102 to form a flux 310 that is lost in space, and only a vanishingly small portion of this "unwanted" radiation is contained in the flux 309 and makes a very small contribution to unwanted heating of the cells 101.

The separation of the "wanted" flux and the "unwanted" flux may be less in this second embodiment, which is nevertheless preferred since an additional advantage is obtained, namely heating of the concentrator 106 and its filter 306. This increased operating temperature greatly limits the trapping of molecules and unwanted particles encountered in space, and the reflective power of the concentrator therefore remains practically constant.

The invention claimed is:

1. A concentrator photovoltaic generator, comprising at least one photoelectric cell covered by a transparent protection layer and further comprising a reflecting concentrator for directing luminous flux toward said at least one photoelectric cell, said concentrator having a reflecting surface for reflecting incident radiation, characterized in that the reflecting surface of said concentrator is covered by a filter such that the incident radiation must pass through said filter to reach said reflecting surface in order to be reflected, and after reflection by said reflecting surface must pass again through said filter in order to be directed toward said at least one photoelectric cell, said filter eliminating in the luminous flux directed by the concentrator toward said at least one photoelectric cell most of "unwanted" radiation that is not able to excite said at least one photoelectric cell.

2. The concentrator photovoltaic generator according to claim 1, characterized in that the filter is formed of a filter layer made from materials absorbing the "unwanted" radiation.

3. The concentrator photovoltaic generator according to claim 2, characterized in that the filter layer is of constant thickness.

4. The concentrator photovoltaic generator according to claim 1, characterized in that the filter is formed of a filter layer whose exterior face is oriented to divert the "unwanted" radiation away from said at least one photoelectric cell.

5. The concentrator photovoltaic generator according to claim 4, characterized in that the filter layer is of decreasing thickness so that the exterior face is not parallel to the reflecting surface of the concentrator.

6. The concentrator photovoltaic generator according to either claim 4, characterized in that the exterior face of the filter layer is etched to form Fresnel steps.

7. The concentrator photovoltaic generator according to claim 1, wherein said filter is formed of a material reflecting the "unwanted" radiation.

\* \* \* \* \*